(12) United States Patent
Wu et al.

(10) Patent No.: US 12,176,432 B2
(45) Date of Patent: Dec. 24, 2024

(54) TRENCH-TYPE MOSFET AND METHOD FOR MANUFACTURING THE SAME

(71) Applicant: Hangzhou Silicon-Magic Semiconductor Technology Co., Ltd., Hangzhou (CN)

(72) Inventors: Bing Wu, Hangzhou (CN); Jiakun Wang, Hangzhou (CN)

(73) Assignee: Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 445 days.

(21) Appl. No.: 17/542,610

(22) Filed: Dec. 6, 2021

(65) Prior Publication Data

US 2022/0181484 A1 Jun. 9, 2022

(30) Foreign Application Priority Data

Dec. 4, 2020 (CN) .......................... 202011401573.7

(51) Int. Cl.
*H01L 29/78* (2006.01)
*H01L 21/765* (2006.01)
(Continued)

(52) U.S. Cl.
CPC ........ *H01L 29/7813* (2013.01); *H01L 21/765* (2013.01); *H01L 29/1095* (2013.01);
(Continued)

(58) Field of Classification Search
CPC ........... H01L 29/7813; H01L 29/66734; H01L 29/4236; H01L 29/7827; H01L 29/407; H01L 21/765
See application file for complete search history.

(56) References Cited

U.S. PATENT DOCUMENTS 10,749,006 B2    8/2020    Li et al.
11,031,496 B2    6/2021    Lin et al.
(Continued)

FOREIGN PATENT DOCUMENTS

CN    210984735 U   *   7/2020
CN    111755500 A   *   10/2020
(Continued)

OTHER PUBLICATIONS

Office Action, including Search Report, for Taiwanese Patent Application No. 110145322, dated Mar. 25, 2022, 11 pages.

*Primary Examiner* — Joseph C. Nicely
(74) *Attorney, Agent, or Firm* — Westman, Champlin & Koehler, P.A.

(57) ABSTRACT

Disclosed is a trench-type MOSFET and a method for manufacturing the same. The method comprises: forming a trench in a semiconductor substrate; forming a first insulating layer and a shielding conductor in the trench; forming an opening on two sides of the shielding conductor in the trench, wherein the opening is separated from the shielding conductor by the first insulating layer; forming a gate dielectric layer and a gate conductor in the opening, wherein the trench extends from an upper surface of the semiconductor substrate into the semiconductor substrate, the first insulating layer covers a sidewall and a bottom of the trench and separates the shielding conductor from the semiconductor substrate, the gate dielectric layer at least covers a sidewall of the opening. The method simplifies the process steps of forming the trench-type MOSFET compared with the prior art, and reduces process errors.

20 Claims, 4 Drawing Sheets

(51) Int. Cl.
 *H01L 29/10* (2006.01)
 *H01L 29/40* (2006.01)
 *H01L 29/423* (2006.01)
 *H01L 29/66* (2006.01)

(52) U.S. Cl.
 CPC .......... *H01L 29/401* (2013.01); *H01L 29/407* (2013.01); *H01L 29/4236* (2013.01); *H01L 29/66734* (2013.01); *H01L 29/7827* (2013.01)

(56) References Cited

U.S. PATENT DOCUMENTS

| | | | |
|---|---|---|---|
| 11,075,296 B2 | 7/2021 | Shirai et al. | |
| 11,094,792 B2 | 8/2021 | Lai et al. | |
| 2014/0077278 A1* | 3/2014 | Nozu | H01L 29/1095 257/773 |
| 2019/0080137 A1* | 3/2019 | Wu | G02F 1/13338 |
| 2019/0355846 A1 | 11/2019 | Shirai et al. | |
| 2020/0227526 A1 | 7/2020 | Li et al. | |
| 2020/0262698 A1* | 8/2020 | Smith | B01D 71/0213 |
| 2020/0328281 A1* | 10/2020 | Lai | H01L 29/401 |
| 2020/0328302 A1* | 10/2020 | Lin | H01L 29/7813 |
| 2021/0020778 A1 | 1/2021 | Su et al. | |
| 2021/0151599 A1* | 5/2021 | Magri' | H01L 21/26513 |
| 2021/0296493 A1 | 9/2021 | Shirai et al. | |
| 2021/0384346 A1* | 12/2021 | Hsieh | H01L 29/0634 |
| 2022/0045210 A1 | 2/2022 | Su et al. | |
| 2022/0149161 A1* | 5/2022 | Hsieh | H01L 29/7813 |
| 2022/0173215 A1* | 6/2022 | Zeng | H01L 29/66727 |

FOREIGN PATENT DOCUMENTS

| | | |
|---|---|---|
| TW | 201947667 A | 12/2019 |
| TW | 202027269 A | 7/2020 |
| TW | 202038313 A | 10/2020 |
| TW | 202038470 A | 10/2020 |
| TW | 202105729 A | 2/2021 |
| WO | WO-2019007319 A1 * | 1/2019 |

* cited by examiner

TRENCH-TYPE MOSFET AND METHOD FOR MANUFACTURING THE SAME

CROSS-REFERENCES TO RELATED APPLICATION(S)

This application claims priority to Chinese Application No. 202011401573.7, filed on Dec. 4, 2020, entitled "trench-type MOSFET and method for manufacturing the same", published as CN112582260A on Mar. 30, 2021, the contents of which are hereby incorporated by reference in their entireties.

BACKGROUND OF THE DISCLOSURE

Field of the Disclosure

The present disclosure relates to a semiconductor technical field, and more particularly, to a trench-type MOSFET and a method for manufacturing a trench-type MOSFET.

Description of the Related Art

Metal oxide semiconductor field effect transistors (MOSFETs) have been widely used as power semiconductor devices, such as switches in power converters.

The semiconductor industry has used various device structures and methods to form MOSFETs, among which a shielded gate trench-type MOSFET has advantages over traditional MOSFETs in having a shielded conductor that help reduce the gate-drain capacitance of the transistor, so that using a shielded gate trench-type MOSFET may reduce the gate-drain capacitance, and increase the cut-off voltage of the transistor. A gate electrode and a shielding electrode are insulated from each other by a dielectric layer, which is also referred to as an interelectrode dielectric (IED) layer. The IED layer must has enough mass and thickness to support a potential difference that may exist between the shielding electrode and the gate electrode. In addition, dielectric-trapped charge quantity and interface-trapped charge quantity at an interface between the shielding electrode and the IED layer and in the IED layer are mainly related to the method used for forming the IED layer.

In the prior art, in order to ensure the IED layer has high quality, sufficient strength and reliability so as to provide required electrical characteristics, the process of forming the IED layer between the gate electrode and the shielding electrode is always complicated, the operation is complex, the process error is large, and the production cost is high. Therefore, it is necessary to propose a method to simplify the process of manufacturing a shielded gate trench-type MOSFET, and to ensure the performance of the shielded gate trench-type MOSFET while reducing the process error.

SUMMARY OF THE DISCLOSURE

In view of this, an objective of the present disclosure is to provide a trench-type MOSFET and a method for manufacturing a trench-type MOSFET, so as to simplify conventional process steps for forming a trench-type MOSFET, reduce process error and reduce production cost.

According to a first aspect of the present disclosure, a method for manufacturing a trench-type MOSFET is provided, and comprises: forming a trench in a semiconductor substrate, wherein the trench extends from an upper surface of the semiconductor substrate into the semiconductor substrate; forming a first insulating layer and a shielding conductor in the trench, wherein the first insulating layer covers a sidewall and a bottom of the trench and separates the shielding conductor from the semiconductor substrate; forming an opening in the trench, wherein the opening is located on two sides of the shielding conductor, separated from the shielding conductor by the first insulating layer and extends from the upper surface of the semiconductor substrate into the trench; forming a gate dielectric layer and a gate conductor in the opening, wherein the gate dielectric layer at least covers a sidewall of the opening and separates the gate conductor from the semiconductor substrate; and forming a body region, a source region, and a drain electrode.

Preferably, the step of forming an opening which is located on two sides of the shielding conductor and in the trench comprises: forming a mask on upper surfaces of the semiconductor substrate, the first insulating layer and the shielding conductor, wherein a region of the opening is defined by use of the mask; etching a portion of the first insulating layer exposed by the mask to form the opening extending from the upper surface of the first insulating layer into the first insulating layer, and removing the mask.

Preferably, the mask is selected as a photoresist layer.

Preferably, the region of the opening defined by the mask is controlled such that the first insulating layer between the gate conductor and the shielding conductor has a sufficient thickness to support a potential difference between the gate conductor and the shielding conductor.

Preferably, the step of forming the first insulating layer and the shielding conductor in the trench comprises: forming the first insulating layer and the shielding conductor which fill the trench and are located on the upper surface of the semiconductor substrate, wherein the first insulating layer covers the sidewall and the bottom of the trench, and the upper surface of the semiconductor substrate; removing a portion of the shielding conductor located on the upper surface of the conductor substrate by a back etching process; and removing a portion of the first insulating layer located on the upper surface of the conductor substrate by a back etching process, wherein a portion of the first insulating layer retained in the trench is flush with an upper surface of the shielding conductor.

Preferably, the step of forming the gate dielectric layer and the gate conductor in the opening comprises: forming a gate dielectric layer in the opening, wherein the gate dielectric layer covers two sidewalls and a bottom of the opening and is conformal with the first insulating layer; depositing gate conductor material on the upper surface of the semiconductor substrate and in the opening covered with the gate dielectric layer, to form the gate conductor; and removing a portion of the gate conductor located on the upper surface of the semiconductor substrate by chemical mechanical planarization or a back etching process.

Preferably, the gate dielectric layer is formed by thermal oxidation.

Preferably, the first insulating layer is formed by low-pressure chemical vapor deposition.

Preferably, the back etching process is a dry etching process.

Preferably, the shielding conductor and the gate conductor are respectively formed by low-pressure chemical vapor deposition.

Preferably, the body region is formed in an upper region of the semiconductor substrate adjacent to the trench, the body region is of a second doping type, wherein the second doping type is opposite to a first doping type; the source region is formed in the body region, the source region is of the first doping type; and the drain electrode is formed on a second surface of the semiconductor substrate, the second surface and the upper surface of the semiconductor substrate are disposed opposite to each other.

Preferably, after the source region is formed, the method further comprises: forming an interlayer dielectric layer above the source region and the trench, wherein at least the whole trench is covered by the interlayer dielectric layer; and forming the source electrode on the interlayer dielectric layer, wherein the source electrode completely covers the interlayer dielectric layer.

Preferably, before the source electrode is formed, the method further comprises: forming a hole penetrating the interlayer dielectric layer and the source region and reaching the body region; forming a body contact region of the second doping type in the body region through the hole; and depositing conductive material in the hole to form a conductive channel through which the source electrode is connected to the body contact region.

Preferably, the semiconductor substrate comprises a semiconductor substrate layer and an epitaxial semiconductor layer on the semiconductor substrate layer, wherein the trench is located in the epitaxial semiconductor layer.

Preferably, being of the first doping type is being doped with one of an N-type dopant and a P-type dopant, and being of the second doping type is being doped with the other one of the N-type dopant and the P-type dopant.

According to a second aspect of the present disclosure, there is provided a trench-type MOSFET comprising: a trench extending from an upper surface of a semiconductor substrate into the semiconductor substrate; a first insulating layer and a shielding conductor both located in the trench, wherein the first insulating layer covers a lower sidewall and a bottom of the trench and separates the shielding conductor from the semiconductor substrate; an opening located in the trench and on two sides of the shielding conductor, wherein the opening and the shielding conductor are separated by the first insulating layer, and the opening extends from the upper surface of the semiconductor substrate into the trench; a gate dielectric layer and a gate conductor both located in the opening, wherein the gate dielectric layer at least covers a sidewall of the opening and separates the gate conductor from the semiconductor substrate; and a body region, a source region, and a drain electrode.

Preferably, the gate dielectric layer covers two sidewalls and a bottom of the opening.

Preferably, the body region is located in an upper region of the semiconductor substrate adjacent to the trench and is of a second doping type, wherein the second doping type is opposite to a first doping type; the source region is located in the body region and is of the first doping type; and the drain electrode is formed on a second surface of the semiconductor substrate, the second surface and the upper surface of the semiconductor are disposed opposite to each other.

Preferably, the trench-type MOSFET further comprises: an interlayer dielectric layer located above the source region and the trench, wherein the interlayer dielectric layer at least covers the whole trench; and a source electrode on the interlayer dielectric layer, wherein the source electrode completely covers the interlayer dielectric layer.

Preferably, the trench-type MOSFET further comprises: a body contact region of the second doping type located in the body region; a conductive channel penetrating the interlayer dielectric layer and the source region and reaching the body contact region, wherein the source electrode extends to the conductive channel and connected to the body contact region via the conductive channel.

According to the trench-type MOSFET and the method for manufacturing the trench-type MOSFET provided by embodiments of the present disclosure, the region of the gate conductor is defined by a photolithography process, and the gate conductor positioned on two sides of the shielding conductor is formed in an upper part of the trench. The process steps of the method are simple, which can not only improve production efficiency, reduce process errors and improve product yield, but may also greatly reduce the manufacturing cost. In addition, in defining the region of the gate conductor, the first insulating layer of a certain thickness is retained between the region of the gate conductor and the shielding conductor, thereby having a sufficient mass and a sufficient thickness to support a potential difference that may exist between the shielding conductor and the gate conductor, so that the performance of the trench-type MOSFET can be improved.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF EMBODIMENTS OF THE DISCLOSURE

Figure 1:
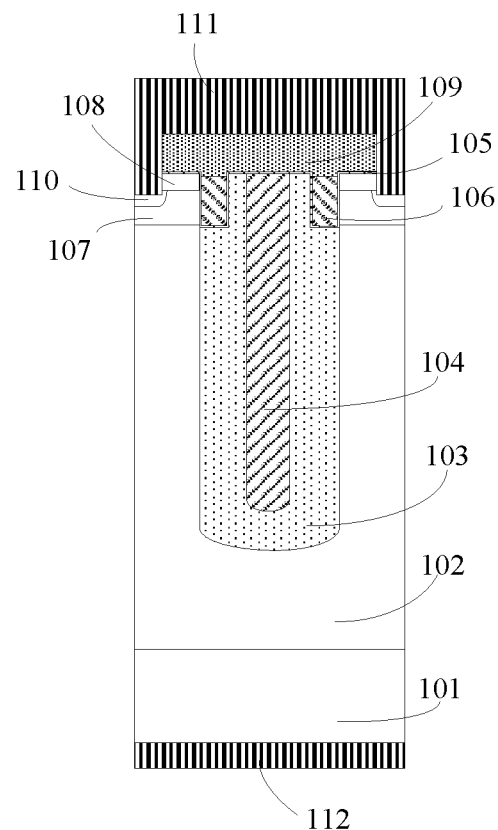
FIG. 1 shows a cross-sectional view of a trench-type MOSFET according to an embodiment of the present disclosure.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be under or below the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in an implantation region of the another region.

In this disclosure, the term "semiconductor structure" refers to a generic designation of an entire semiconductor structure which is formed in each step of manufacturing a semiconductor device, and includes all layers or regions that have been formed. The term "transversely extending" means extending in a direction substantially perpendicular to a depth direction of a trench.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Unless otherwise specified below, portions of a semiconductor device may be constructed of materials well known to those skilled in the art. Semiconductor materials include, for example, Group III-V semiconductors such as GaAs, InP, GaN, SiC, and Group IV semiconductors such as Si, Ge. A gate conductor may be formed of various materials capable of conducting electricity, such as a metal layer, a doped polysilicon layer, or a stacked gate conductor comprising a metal layer and a doped polysilicon layer, or other conductive materials, such as TaC, TiN, TaSiN, HfSiN, TiSiN, TiCN, TaAlC, TiAlN, TaN, PtSix, Ni3Si, Pt, Ru, W, and their combinations. The gate dielectric may be made of SiO2 or other material having a dielectric constant greater than SiO2, such as an oxide, a nitride, an oxynitride, a silicate, an aluminate and a titanate. Moreover, the gate dielectric may not only be made of materials well known to those skilled in the art, but also be made of those materials to be developed for gate dielectric in the future.

The present disclosure may be presented in various forms, some examples of which will be described below.

FIG. 1 shows a cross-sectional view of a trench-type MOSFET according to an embodiment of the present disclosure.

In the present disclosure, a semiconductor substrate comprises a semiconductor substrate layer 101 and an epitaxial semiconductor layer 102 on the semiconductor substrate layer, the semiconductor substrate layer 101 is, for example, made of silicon, and is of a first doping type. Being of the first doping type is being doped with one of an N-type dopant and a P-type dopant, and being of the second doping type is being doped with the other one of the N-type dopant and the P-type dopant. In order to form an N-type epitaxial semiconductor layer or region, the N-type dopant (e.g., P, As) may be implanted in the epitaxial semiconductor layer or region. To form a P-type epitaxial semiconductor layer or region, the P-type dopant (e.g., B) may be doped in the epitaxial semiconductor layer or region. In an example, the semiconductor substrate layer 101 is doped with an N-type dopant.

The epitaxial semiconductor layer 102 of the first doping type is located on a surface of the semiconductor substrate layer 101 (i.e., a first surface of the semiconductor substrate layer 101) opposite to a drain electrode 112. The epitaxial semiconductor layer 102 is made of, for example, silicon. The epitaxial semiconductor layer 102 is a lighter doped layer compared with the semiconductor substrate layer 101. A second surface of the semiconductor substrate layer is thinned by a thinning process and the drain electrode 112 is formed on the second surface of the semiconductor substrate layer. In some embodiments, a buffer layer may be also provided between the semiconductor substrate layer 101 and the epitaxial semiconductor layer 102, wherein the buffer layer and the semiconductor substrate layer are doped with a same type of dopant, in order to reduce interface instability between the semiconductor substrate layer and the epitaxial semiconductor layer due to defects of the substrate layer.

A trench extends from the upper surface of the epitaxial semiconductor layer 102 into the epitaxial semiconductor layer 102 and ends in the epitaxial semiconductor layer 102. A first insulating layer 103 and a shielding conductor 104 are formed in the trench, the first insulating layer 103 covers a sidewall and a bottom of the trench, and the first insulating layer 103 separates the shielding conductor 104 from the epitaxial semiconductor layer 102. An opening is located in the trench and on two sides of the shielding conductor 104, the opening and the shielding conductor are separated by the first insulating layer 103, and the opening extends from the upper surface of the epitaxial semiconductor layer into the trench. A gate dielectric layer 105 and a gate conductor 106 are located in the opening, the gate dielectric layer 105 at least covers a sidewall of the opening. In an embodiment, the gate dielectric layer 105 may cover two sidewalls and a bottom of the opening, and separates the gate conductor 106 from the epitaxial semiconductor layer 102. The gate conductor 106 and the shielding conductor 104 are insulated against each other by use of the gate dielectric layer 105 and the first insulating layer 103, which has a sufficient thickness to support a potential difference between the shielding conductor 104 and the gate conductor 106. Further, the gate dielectric layer 105 may also comprise portions located on the upper surfaces of the epitaxial semiconductor layer 102, the first insulating layer 103 and the shielding conductor 104. In some embodiments, the first insulating layer 103 may be made of an oxide or a nitride, for example, silicon oxide or silicon nitride; the gate dielectric layer 105 may be made of an oxide, for example, silicon oxide; the shielding conductor 104 and the gate conductor 106 may be made of polysilicon.

A body region 107 of the second doping type is located in an upper region of the epitaxial semiconductor layer 102 adjacent to the trench, wherein a junction depth of the body region 107 is not larger than the depth of the gate conductor 106 in the trench; a source region 108 of the first doping type is located in the body region 107; and a body contact region 110 of the second doping type is located in the body region 107. The second doping type is opposite to the first doping type, being of the first doping type is being doped with one of an N-type dopant and a P-type dopant, and being of the second doping type is being doped with the other one of the N-type dopant and the P-type dopant. An interlayer dielectric layer 109 is formed above the source region 108 and the trench, wherein the interlayer dielectric layer 109 at least covers the whole trench; while at a position next to the source region 108, a conductive channel penetrates the interlayer dielectric layer 109 and the source region 108 and reaches the body contact region 110; a source electrode 111 is located on the interlayer dielectric layer 109, the source electrode 111 completely covers the interlayer dielectric layer 109 and extends to the conductive channel through which the source electrode 111 is connected to the body contact region 110. The interlayer dielectric layer 109 may be an oxide layer having a certain thickness, for example, a silicon oxide layer.

The shielding conductor 104 and the source electrode 111 may be connected together in a cell region, i.e., a channel which is conductive and configured to connect the source electrode 111 and the shielding conductor 104 together can be formed in the interlayer dielectric layer 109 above the shielding conductor. Of course, the shielding conductor 104 and the source electrode 111 may also be connected together at an edge of a chip, the method for connecting the shielding conductor and the source electrode is not limited herein.

FIGS. 2a to 2g show cross-sectional views of various stages of a method for manufacturing a trench-type MOSFET according to the present disclosure.

Figure 2A:
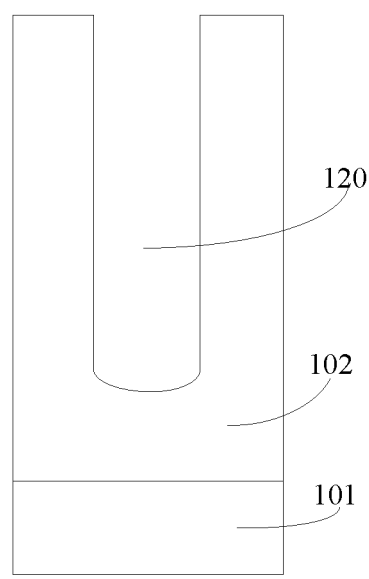
FIGS. 2a to 2g show cross-sectional views of various stages of a method for manufacturing a trench-type MOSFET according to an embodiment of the present disclosure.

As shown in FIG. 2a, a trench extending from a surface of a semiconductor substrate to an interior of the semiconductor substrate is formed in the semiconductor substrate.

Specifically, in the present disclosure, the semiconductor substrate comprises a semiconductor substrate layer 101 and an epitaxial semiconductor layer 102 on the semiconductor substrate layer 101. An oxide layer is formed on the epitaxial semiconductor layer 102. Then, a photoresist layer is formed on the oxide layer, and then an etching process is performed. The etching process may be a dry etching process, such as an ion milling etching process, a plasma etching process, a reactive ion etching process, a laser ablation process, or a selective wet etching process using an etching solution, and etch down from a position exposed by the photoresist layer which is used as a mask to form an opening in the oxide layer, thereby patterning the oxide layer to form a hard mask. Due to etching selectivity, the etching can be stopped on the surface of the epitaxial semiconductor layer 102. After the hard mask is formed, the photoresist layer is removed by ashing or dissolution in a solvent.

By use of the hard mask, the epitaxial semiconductor layer 102 is further etched by the above-mentioned known etching process, and a trench 120 is further formed in the epitaxial semiconductor layer 102. The trench 120 extends into the epitaxial semiconductor layer 102 from the upper surface of the epitaxial semiconductor layer 102. For example, by control of the time of etching, the depth of the trench 120 can be controlled. As shown in FIG. 2a, the trench 120 ends in the epitaxial semiconductor layer 102. After the trench 120 is formed, the hard mask may be removed by a selective etchant with respect to the epitaxial semiconductor layer.

Figure 2B:
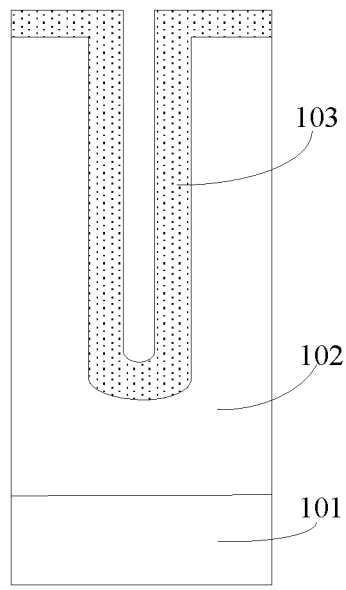

Subsequently, as shown in FIG. 2b, a first insulating layer 103 is formed in the interior of the trench and on the upper surface of the epitaxial semiconductor layer 102 by thermal oxidation or chemical vapor deposition, that is, the first insulating layer 103 covers the bottom and the sidewall of the trench, and the upper surface of the epitaxial semiconductor layer. The first insulating layer 103 may be made of an oxide or a nitride, for example, silicon oxide or silicon nitride.

Figure 2C:
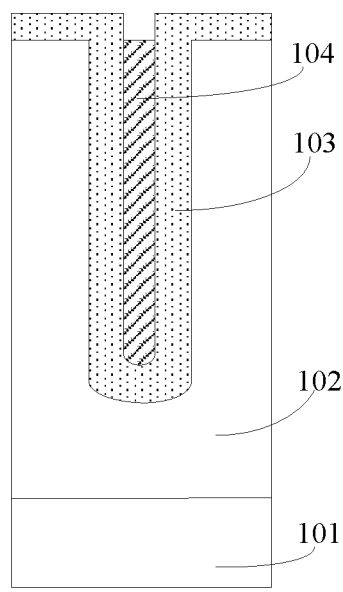

Then, as shown in FIG. 2c, a shielding conductor is formed in the interior of the trench and on the upper surface of the epitaxial semiconductor layer 102 by low-pressure chemical vapor deposition. The first insulating layer 103 is configured to separate the shielding conductor from the epitaxial semiconductor layer 102.

Firstly, a chemical mechanical abrasion process is performed on the shielding conductor, and then the shielding conductor is selectively etched back with respect to the first insulating layer 103 so that a portion of the shielding conductor located on the upper surface of the epitaxial semiconductor layer 102 and above the trench is removed, and a remaining portion of the shielding conductor is shown as the shielding conductor 104 in FIG. 2c. The back etching process may be a dry etching process, and the shielding conductor 104 may be made of polysilicon.

Figure 2D:
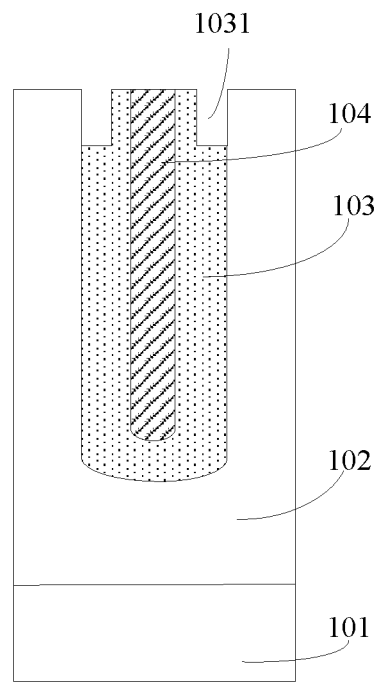

Then, as shown in FIG. 2d, a portion of the first insulating layer located on the upper surface of the epitaxial semiconductor layer 102 is removed by a back etching process so that the upper surface of a portion of the first insulating layer retained in the trench is flush with the upper surface of the shielding conductor.

A first mask is formed on the upper surfaces of the semiconductor substrate, the first insulating layer, and the shielding conductor, a region of an opening 1031 is defined by use of the first mask. A portion of the first insulating layer exposed by the first mask is etched to form the opening 1031 after which the first mask is removed. The first mask is preferably a photoresist layer, and a photoresist pattern is formed by a photolithography process to define the region of the opening 1031. The opening 1031 is located on two sides of the shielding conductor, separated from the shielding conductor 104 by the first insulating layer 103, and extends from the upper surface of the first insulating layer into the trench.

Figure 2E:
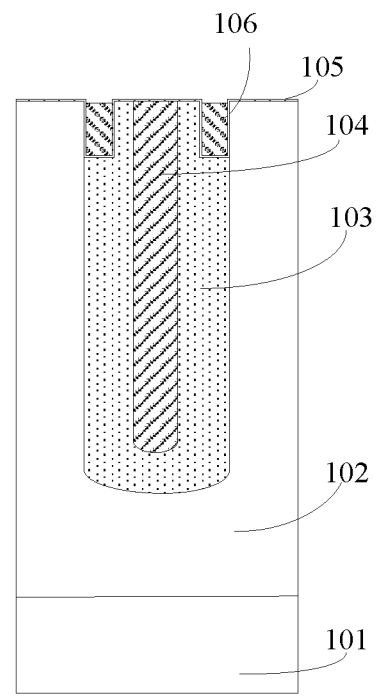

Then, as shown in FIG. 2e, a gate dielectric layer and a gate conductor are formed in the opening 1031. Specifically, the gate dielectric layer 105 is formed in the opening 1031 by thermal oxidation, the gate dielectric layer 105 at least covers a sidewall of the opening, preferably the inner sidewall and a bottom of the opening 1031 are covered by the gate dielectric layer 105, the gate dielectric layer 105 is conformal with the first insulating layer 103. In this embodiment, the gate dielectric layer 105 further comprises portions located on the upper surfaces of the epitaxial semiconductor layer 102, the first insulating layer 103 and the shielding conductor 104. In a subsequent ion implantation process, the gate dielectric layer 105 may also be used to protect the upper surface of the epitaxial semiconductor layer 102 from damage. Of course, without any limitation herein, the portions of the gate dielectric layer 105 on the upper surfaces of the epitaxial semiconductor layer 102, the first insulating layer 103 and the shielding conductor 104 may also be removed in other embodiments. The gate dielectric layer 105 is an oxide, such as silicon oxide. The thermal oxidation is usually achieved by performing a chemical reaction between silicon and gas containing an oxidizing substance, such as water vapor and oxygen, at high temperature, to produce a dense silicon dioxide (SiO2) film on a surface of silicon wafer, and is an important process in silicon planar technology.

By means of low-pressure chemical vapor deposition, the gate conductor is formed in an opening covered with the gate dielectric layer 105 and on the upper surface of the epitaxial semiconductor layer 102, and then a portion of the gate conductor located on the upper surface of the epitaxial semiconductor layer is removed by a back etching process or chemical mechanical planarization, so that an upper end of the gate conductor 106 ends at the upper surface of the opening. The gate conductor 106 is located on two sides of the shielding conductor 104, and the gate conductor 106 is insulated from the shielding conductor 104 by the first insulating layer 103. The region of the opening defined by the first mask is controlled, such that the first insulating layer between the gate conductor 106 and the shielding conductor 104 can have a sufficient thickness to support a potential difference between the gate conductor and the shielding conductor.

Figure 2F:
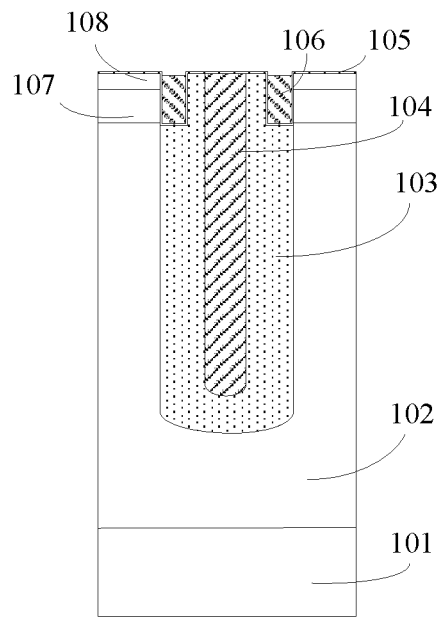

Then, as shown in FIG. 2f, a first ion implantation is performed using a conventional bulk implantation and drive-in technique to form a body region 107 of the second doping type in an upper region of the epitaxial semiconductor layer 111 adjacent to the trench. Further, a second ion implantation is performed to form a source region 108 of the first doping type in the body region 107. The body region 107 is of the second doping type opposite to the doping type of the epitaxial semiconductor layer 102, which is doped of the first doping type. A desired depth and a required doping concentration can be achieved by controlling parameters of ion implantation, such as implantation energy and dose. The depth of the body region 107 does not exceed an extension depth of the gate conductor 106 in the trench. By use of an additional photoresist mask, a lateral extension region of the body region 107 and the source region 108 can be controlled. Preferably, the body region 107 and the source region 108 are adjacent to the trench, respectively.

Figure 2G:
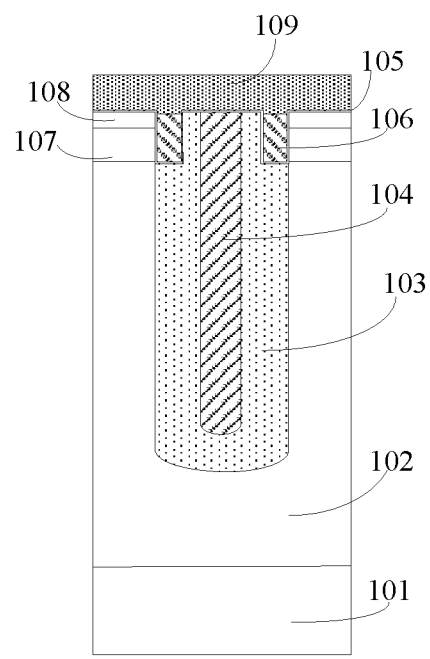

Subsequently, as shown in FIG. 2g, an interlayer dielectric layer 109 is formed above the source region 108 and the trench by the above-described known deposition process, and if necessary, chemical mechanical planarization is further performed to obtain a flat surface. The interlayer dielectric layer 109 at least covers the whole trench, moreover, the interlayer dielectric layer 109 covers top surfaces of the source region 108, the gate conductor 106 and the shielding conductor 104, and the portion of the gate dielectric layer located on the upper surface of the epitaxial semiconductor layer may be selected to be removed by etching after the source region is formed, or may not be removed. If the portion of the gate dielectric layer located on the upper surface of the epitaxial semiconductor layer is not removed, it may be conformal with the interlayer dielectric layer 109 and located above the source region 108.

Then, as shown in FIG. 1, a hole penetrating the interlayer dielectric layer 109 and the source region 108 is formed by the above-described known etching process. A body contact region 110 of the second doping type is formed in the body region 107 through the hole by the above-described known ion implantation process. Then, conductive material is deposited in the hole to form a conductive channel A source electrode 111 is formed on the interlayer dielectric layer 109 and in the conductive channel, the source electrode 111 completely covers the interlayer dielectric layer 109 and extends to the conductive channel. The source electrode 111 is connected to the body contact region 110 via the conductive channel. Then, a drain electrode 112 is formed on the second surface of the semiconductor substrate layer 101, thinned by a thinning process, by the above-described known deposition process.

In the above embodiments, the source electrode 111 and the drain electrode 112 may be respectively made of a conductive material, including a metal material such an aluminum alloy or copper.

According to the embodiments of the present disclosure, the method for manufacturing the trench-type MOSFET is provided, wherein the region of the gate conductor is defined by a photolithography process, and the gate conductor positioned on two sides of the shielding conductor is formed in the first insulating layer in an upper part of the trench. The process steps of the method are simple, which can not only improve production efficiency, reduce process errors and improve product yield, but also greatly reduce manufacturing cost. In addition, in defining the region of the gate conductor, the first insulating layer of a certain thickness is retained between the region of the gate conductor and the shielding conductor, thereby having sufficient mass and thickness to support a potential difference that may exist between the shielding conductor and the gate conductor, so that the performance of the trench-type MOSFET can be improved.

It should be understood that the relational terms such as "first", "second", and the like are used in the context merely for distinguishing one element or operation form the other element or operation, instead of meaning any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A method for manufacturing a trench-type MOSFET, comprising:

forming a trench in a semiconductor substrate, wherein the trench extends from an upper surface of the semiconductor substrate into the semiconductor substrate;

forming a first insulating layer and a shielding conductor in the trench, wherein the first insulating layer covers a sidewall and a bottom of the trench and separates the shielding conductor from the semiconductor substrate;

forming an opening in the trench, wherein the opening is located on two sides of the shielding conductor, separated from the shielding conductor by the first insulating layer, and extends from the upper surface of the semiconductor substrate into the trench;

forming a gate dielectric layer and a gate conductor in the opening, wherein the gate dielectric layer at least covers a sidewall of the opening and separates the gate conductor from the semiconductor substrate; and forming a body region, a source region, and a drain electrode, wherein a space between the shielding conductor and the opening is completely filled with an upper portion of the first insulating layer only, so that a horizontal distance between the shielding conductor and the gate conductor is a sum of a horizontal width of the upper portion of the first insulating layer and a thickness of the gate dielectric layer, and the horizontal width of the upper portion of the first insulating layer is greater than the thickness of the gate dielectric layer.

2. The method according to claim 1, wherein the step of forming the opening located on two sides of the shielding conductor and in the trench comprises:

forming a mask on upper surfaces of the semiconductor substrate, the first insulating layer and the shielding conductor, wherein a region of the opening is defined by use of the mask;

etching a portion of the first insulating layer exposed by the mask to form the opening extending from the upper surface of the first insulating layer into the first insulating layer; and removing the mask.

3. The method according to claim 2, wherein the mask is selected as a photoresist layer.

4. The method according to claim 2, wherein the region of the opening defined by the mask is controlled, such that the first insulating layer between the gate conductor and the shielding conductor has a sufficient thickness to support a potential difference between the gate conductor and the shielding conductor.

5. The method according to claim 1, wherein the step of forming the first insulating layer and the shielding conductor in the trench comprises:
  forming the first insulating layer and the shielding conductor which fill the trench and are located on the upper surface of the semiconductor substrate, wherein the first insulating layer covers the sidewall and the bottom of the trench, and the upper surface of the semiconductor substrate;
  removing a portion of the shielding conductor located on the upper surface of the semiconductor substrate by a first back etching process; and
  removing a portion of the first insulating layer located on the upper surface of the semiconductor substrate by a second back etching process,
  wherein a portion of the first insulating layer retained in the trench is flush with an upper surface of the shielding conductor.

6. The method according to claim 5, wherein the first back etching process is a first dry etching process, and/or the second back etching process is a second dry etching process.

7. The method according to claim 1, wherein the step of forming the gate dielectric layer and the gate conductor in the opening comprises:
  forming the gate dielectric layer in the opening, wherein the gate dielectric layer covers two sidewalls and a bottom of the opening, and is conformal with the first insulating layer;
  depositing gate conductor material on the upper surface of the semiconductor substrate and in the opening covered with the gate dielectric layer, to form the gate conductor; and
  removing a portion of the gate conductor located on the upper surface of the semiconductor substrate by chemical mechanical planarization or a back etching process.

8. The method according to claim 1, wherein the gate dielectric layer is formed by thermal oxidation.

9. The method according to claim 1, wherein the first insulating layer is formed by low-pressure chemical vapor deposition.

10. The method according to claim 1, wherein the shielding conductor and the gate conductor are respectively formed by low-pressure chemical vapor deposition.

11. The method according to claim 1, wherein,
  the body region is formed in an upper region of the semiconductor substrate adjacent to the trench, the body region is of a second doping type, the second doping type is opposite to a first doping type;
  the source region is formed in the body region, the source region is of the first doping type; and
  the drain electrode is formed on a second surface of the semiconductor substrate, the second surface and the upper surface of the semiconductor are disposed opposite to each other.

12. The method according to claim 11, wherein, after the source region is formed, the method further comprises:
  forming an interlayer dielectric layer above the source region and the trench, wherein at least the whole trench is covered by the interlayer dielectric layer; and
  forming the source electrode on the interlayer dielectric layer, wherein the source electrode completely covers the interlayer dielectric layer.

13. The method according to claim 12, wherein, before the source electrode is formed, the method further comprises:
  forming a hole penetrating the interlayer dielectric layer and the source region and reaching the body region;
  forming a body contact region of the second doping type in the body region through the hole; and
  depositing conductive material in the hole to form a conductive channel through which the source electrode is connected to the body contact region.

14. The method according to claim 1, wherein the semiconductor substrate comprises a semiconductor substrate layer and an epitaxial semiconductor layer on the semiconductor substrate layer, wherein the trench is located in the epitaxial semiconductor layer.

15. The method according to any one of claim 1, wherein being of the first doping type is being doped with one of an N-type dopant and a P-type dopant, and being of the second doping type is being doped with the other one of the N-type dopant and the P-type dopant.

16. A trench-type MOSFET, comprising:
  a trench extending from an upper surface of a semiconductor substrate into the semiconductor substrate;
  a first insulating layer and a shielding conductor both located in the trench, wherein the first insulating layer covers a lower sidewall and a bottom of the trench and separates the shielding conductor from the semiconductor substrate;
  an opening located in the trench and on two sides of the shielding conductor, wherein the opening is separated from the shielding conductor by the first insulating layer, and extends from the upper surface of the semiconductor substrate into the trench;
  a gate dielectric layer and a gate conductor both located in the opening, wherein the gate dielectric layer at least covers a sidewall of the opening and separates the gate conductor from the semiconductor substrate, and
  a body region, a source region and a drain electrode,
  wherein a space between the shielding conductor and the opening is completely filled with an upper portion of the first insulating layer only, so that a horizontal distance between the shielding conductor and the gate conductor is a sum of a horizontal width of the upper portion of the first insulating layer and a thickness of the gate dielectric layer, and the horizontal width of the upper portion of the first insulating layer is greater than the thickness of the gate dielectric layer.

17. The trench-type MOSFET according to claim 16, wherein the gate dielectric layer covers two sidewalls and a bottom of the opening.

18. The trench-type MOSFET according to claim 16, wherein the body region is located in an upper region of the semiconductor substrate adjacent to the trench and is of a second doping type, wherein the second doping type is opposite to a first doping type;
  the source region is located in the body region and is of the first doping type; and
  the drain electrode is formed on a second surface of the semiconductor substrate, the second surface and the upper surface of the semiconductor are disposed opposite to each other.

19. The trench-type MOSFET according to claim 18, further comprising: an interlayer dielectric layer located above the source region and the trench, wherein the interlayer dielectric layer at least covers the whole trench; and
  a source electrode on the interlayer dielectric layer, wherein the source electrode completely covers the interlayer dielectric layer.

20. The trench-type MOSFET according to claim 19, further comprising:
  a body contact region of a second doping type located in the body region;

a conductive channel penetrating the interlayer dielectric layer and the source region and reaching the body contact region, wherein the source electrode extends to the conductive channel and connected to the body contact region via the conductive channel.

* * * * *